United States Patent [19]

Allovon et al.

[11] Patent Number: 4,607,152

[45] Date of Patent: Aug. 19, 1986

[54] VACUUM EVAPORATION DEVICE

[76] Inventors: Michel Allovon, 6 rue A.J. Caron, 94110 Arcueil; Leon Goldstein, 32 rue de La Monesse, 92310 Sevres, both of France

[21] Appl. No.: 634,434

[22] Filed: Jul. 26, 1984

[30] Foreign Application Priority Data

Jul. 26, 1983 [FR] France .................................. 83 12329

[51] Int. Cl.⁴ ..................... C23C 14/26; H01L 21/203; H05B 3/06
[52] U.S. Cl. ..................................... 219/390; 219/271; 219/275; 118/727
[58] Field of Search ........................ 219/390, 271, 275; 118/727, 726, 724, 50.1, 733; 427/49, 50, 51; 148/DIG. 6

[56] References Cited

U.S. PATENT DOCUMENTS

| | | | |
|---|---|---|---|
| 2,551,389 | 5/1951 | Oliver | 118/733 |
| 2,958,899 | 11/1960 | Stein | 118/724 |
| 3,281,517 | 10/1966 | Hemmer | 118/726 |
| 3,594,242 | 7/1971 | Burd | 118/724 |
| 3,661,117 | 5/1972 | Cornelius | 219/275 |
| 3,703,155 | 11/1972 | Choisser | 118/48 |
| 4,061,800 | 12/1977 | Anderson | 219/271 |
| 4,239,955 | 12/1980 | Cho | 219/271 |
| 4,472,622 | 9/1984 | Satoh | 219/390 |

FOREIGN PATENT DOCUMENTS 1621267 9/1971 Fed. Rep. of Germany .
2466513 4/1981 France .

OTHER PUBLICATIONS

Budo, Y., "Integrated Sputter Etching...", IBM Tech. Disc. Bull., vol. 19, No. 8, Jan. 1977, pp. 2823-2825.
Howell, J. R., "Evaporant Source", IBM Tech. Disc. Bull., vol. 9, No. 12, May 1967, p. 1677.

Primary Examiner—Clarence L. Albritton
Assistant Examiner—Teresa J. Walberg
Attorney, Agent, or Firm—Oblon, Fisher, Spivak, McClelland & Maier

[57] ABSTRACT

A vacuum evaporation device incorporates a main treatment enclosure connected to an auxiliary chamber containing a material evaporation cell. The cell is fixed to a tight bellows displacement member able to displace the cell between a first advanced position towards a main enclosure and a second retracted position. A sealing valve provided with a slide is provided for the main enclosure from the auxiliary chamber, whereby the material of the evaporation cell can thus be changed without placing the main enclosure under atmosphere again. A fixed heating tube, connecting the main enclosure to the auxiliary chamber, has a first end engaged in the main enclosure and a second end issuing into the auxiliary chamber. The second end is provided with an end piece made from a thermally insulating material ensuring mechanical continuity and thermal insulation with the support part and able to bearingly receive the evaporation cell when the latter is in the advanced position. The slide of the sealing valve is inserted between the end piece and the evaporation cell when the latter is in the retracted position, the travel of the cell between these end positions and consequently travel of the bellows being limited to the space necessary for closing the valve.

6 Claims, 3 Drawing Figures

VACUUM EVAPORATION DEVICE

BACKGROUND OF THE INVENTION

The present invention relates to a vacuum evaporation device, which is more particularly used in molecular jet epitaxy installations.

A vacuum evaporation installation, which is e.g. used in the production of semiconductors by molecular jet epitaxy, generally comprises a main enclosure connected to pumping means (primary and secondary pumps) and containing the substrates to be treated, as well as one or more evaporation cells containing the material or materials to be evaporated.

In order to permit the recharging of these cells with various materials and without breaking the vacuum of the main enclosure, installations have been developed in which the evaporation cell to be recharged is detachable and is connected to the main enclosure by a metal bellows. When the bellows is compressed, the cell is in the normal evaporation position in the enclosure, whilst when the bellows is stretched, the cell is retracted out of the main enclosure into a small auxiliary chamber. This chamber can be separated from the main enclosure by the action of a tight ultra-high vacuum valve. Such an installation makes it possible to recharge the cell while only placing the auxiliary chamber under atmosphere again.

Although satisfactory from certain respects, such installations suffer from disadvantages due to the very significant travel which has to be given to the bellows (more than 500 mm), which leads to:
- high costs, due both to the cost of the bellows and that of the guidance and translation system, which must be very accurate to ensure a correct alignment over a considerable distance,
- a risk of pollution of the enclosure by the effect of degassing operations of the long bellows,
- high weight,
- large overall dimensions, which is prejudicial to access to the other cells.

SUMMARY OF THE INVENTION

The invention aims at obviating these disadvantages. It therefore recommends the use of a device making it possible to considerably reduce the travel or stroke of the bellows, which drops to approximately 500 mm, i.e. 1/10 of the prior art value. There is consequently a considerable reduction to the cost of the installation, the risks of degassing, the overall dimensions and the weight.

This reduction in the length of the bellows is made possible by the use of a fixed heating tube connecting the main enclosure to the auxiliary chamber, which makes it possible for the evaporation cell to operate in the auxiliary chamber and to pass the vapours produced into the main chamber. This tube has a first end engaged in the main enclosure and a second end issuing into the auxiliary chamber. This second end is provided with a part able to bearingly receive the evaporation cell, when the latter is in the advanced position. The slide of the sealing valve is inserted in said end part and the evaporation cell, when the latter is in the retracted position. Thus, the travel of the cell between its two end positions and consequently the travel of the bellows are limited to the space necessary for the closing of the valve.

The device according to the invention is particularly advantageous in the case of processes using low temperatures (less than approximately 500° C.) and using volatile materials such as arsenic, phosphorus, semiconductor material of type III–V or more generally all elements of columns IIB, V and VI of the periodic classification. It is these materials which cause the most serious problems in connection with the recharging of a processing installation.

BRIEF DESCRIPTION OF THE DRAWINGS

The invention is described in greater detail hereinafter relative to non-limitative embodiments then and the attached drawings, wherein show.

DETAILED DESCRIPTION OF THE PREFERRED EMBODIMENTS

Figure 1:
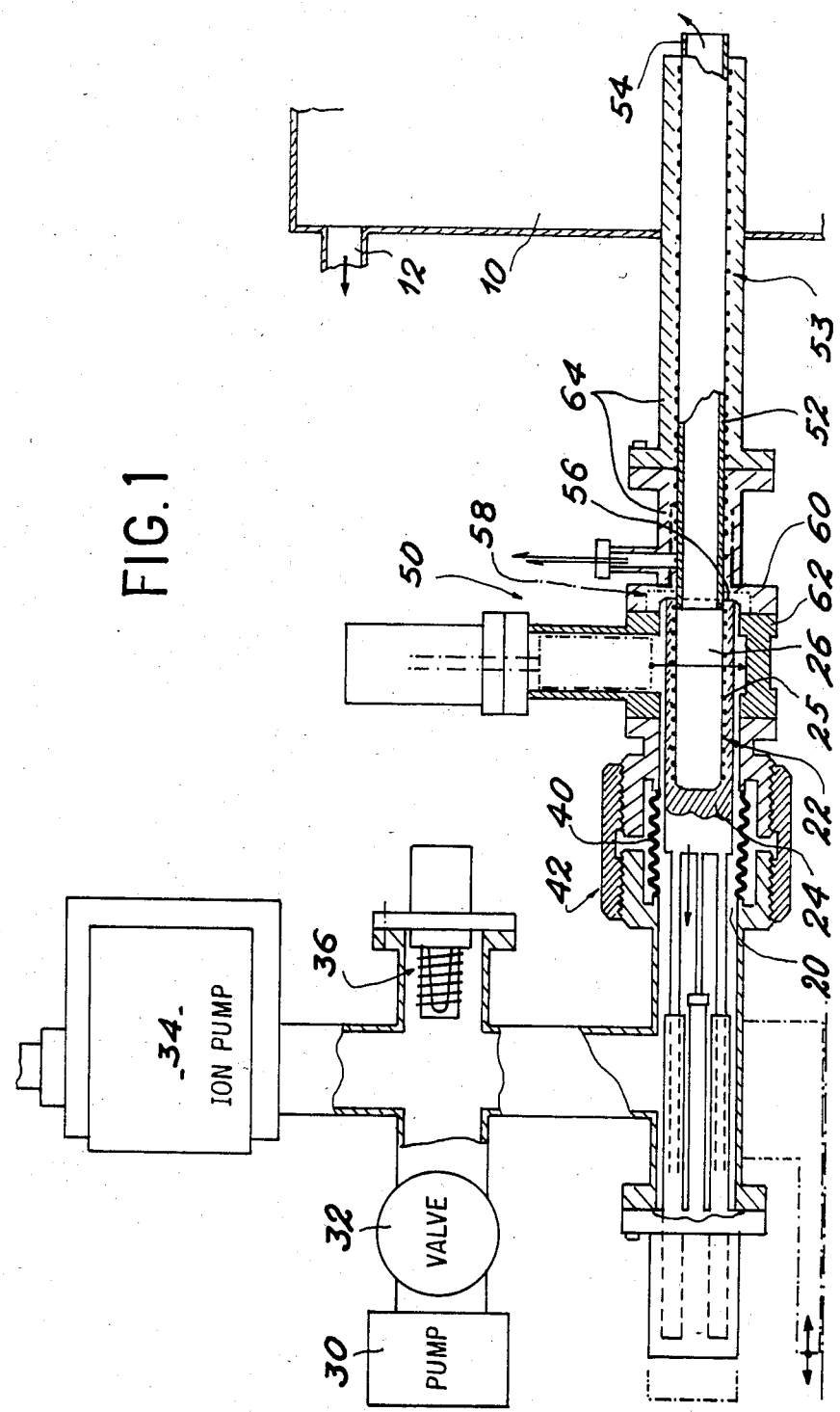
FIG. 1 diagrammatically, the device according to the invention.

The installation shown in FIG. 1 essentially comprises on the one hand a main enclosure 10 in which the epitaxial growth takes place (on not shown substrates), said enclosure being connected by a pipe 12 to not shown pumping means, and on the other hand an auxiliary chamber 20 containing an evaporation cell 22 constituted by a heating unit 24, perforated by a cavity 26 containing the material to be evaporated. This unit is provided with a heating resistor 25. The auxiliary chamber is connected to autonomous pumping means constituted by a primary pump 30 associated with an insulating valve 32, as well as an ion pump 34. The vacuum can be measured by means of a gauge 36.

Figure 2:
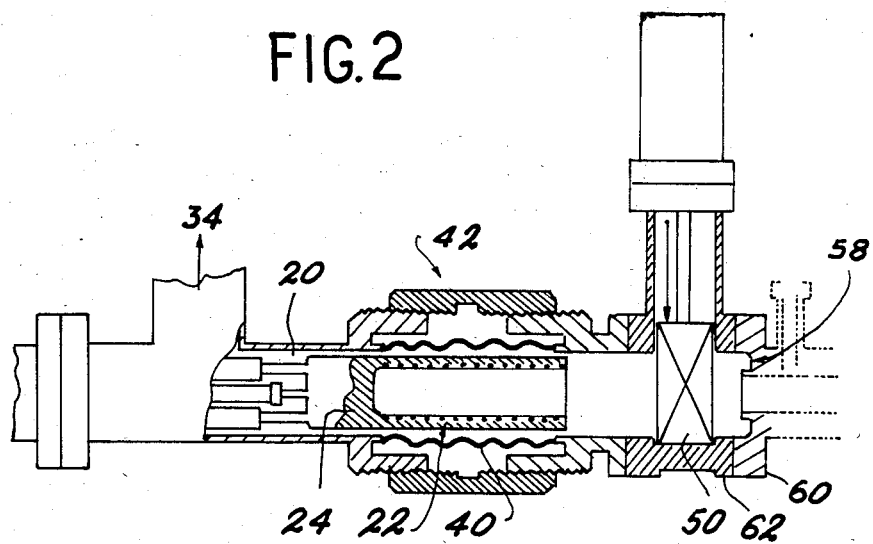
FIG. 2 the portion relating to the rechargeable cell in the retracted position.

Cell 22 is retractable by the mechanical means essentially constituted by a bellows 40 associated with a bellows guidance mechanism 42. FIG. 1 shows the cell in the advanced position and FIG. 2 the same cell in the retracted position. A slide valve 50 makes it possible to insulate the main enclosure 10 from the auxiliary chamber 20, when the cell is retracted (FIG. 2).

Figure 3:
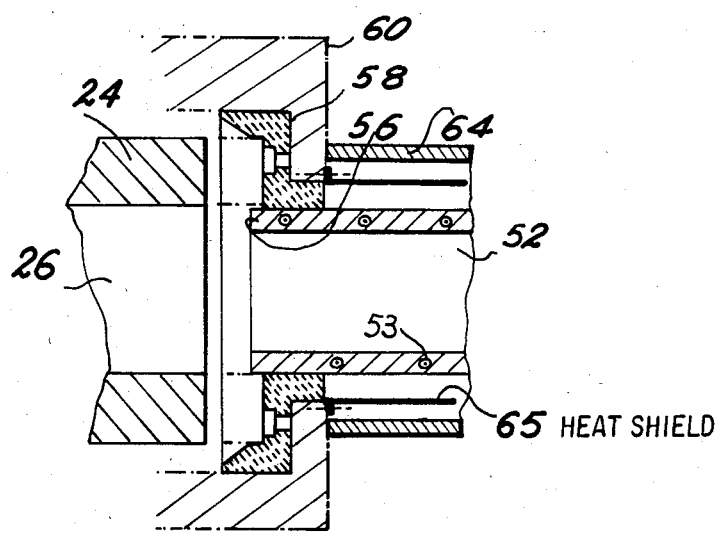
FIG. 3 in section, the end part integral with the heating tube.

According to the essential feature of the invention, enclosure 10 and chamber 20 are joined by a tube 52, which is provided with a heating filament 53. This tube has a first end 54, which penetrates enclosure 10 and a second end 56, which issues onto the chamber 20. The second end is integral with a part 58 (whereof a detail is shown in FIG. 3) fixed to a support 60 rendered integral with the valve body 62. Tube 52 can be surrounded by a heat shield 65, the assembly being located in a mechanical holding tube 64.

FIG. 3 shows in more detailed manner the shape of the different parts in the vicinity of end part 58. The latter surrounds the heating tube over the portion entering the auxiliary chamber. This part mainly ensures a certain sealing between cell 22 and heating tube 52 to prevent a portion of the evaporated material from being deposited on valve 50, as well as a thermal insulation between the hot parts (cell and tube) and the external support 60 connected to tube 64.

The essential function of tube 52 is to pass the evaporated material flow from the evaporation cell 22 to the treatment enclosure 10, whilst preventing the material from being deposited prior to the substrates as a result of its high temperature. However, this tube can also have another function, namely that of preventing thermal cracking of certain products. This second function naturally requires a higher temperature and the equipping of the interior of tube 52 with e.g. baffles. Such baffles or obstacles can also be introduced into the tube to prevent an excessive "focusing" of the gas flow.

A comparison between FIGS. 1 and 2 clearly shows that the maximum displacement of the evaporation cell approximately equals the width of the slide of valve 50. In the invention, the cell remains in chamber 20, even in the advanced position and, unlike in the prior art, does not have to be introduced into the main enclosure 10. Thus, bellows 40 can have a travel which only slightly exceeds the said width, i.e. approximately 50 mm, as opposed to 500 mm in the prior art.

For illustration purposes, tube 52 can be made from silica, whilst filament 53 can be made from tantalum. Heat shield 65 can also be made from tantalum. End piece 58 can be of alumina and support 60 can be of stainless steel and current passages are provided for filament 53. Bellows 40 is preferably metallic and auxiliary chamber 20 is made from stainless steel. The heating tube 52 can be constituted by a metal tube surrounded by a heating filament which is electrically insulated from the tube.

With respect to the auxiliary pumping means or valves, RIBER equipment has been successfully used by the Applicants, namely ion pump PI-25 of 25 l/s for pump 34, insulating valve W 38S for valve 32, slide valve VTA 38 for valve 50, chamber 2300 for enclosure 10 and cell CBN 125-L.

It is obvious that the above description only refers to molecular jet epitaxy in an illustrative manner and that the invention can have wider applications in any installation using vacuum evaporation.

What is claimed is:

1. A vacuum evaporation device incorporating a main treatment enclosure connected to an auxiliary chamber containing a material evaporation cell, said cell being fixed to a tight bellows displacement member able to displace the cell between a first advanced position towards a main enclosure and a second retracted position, a sealing valve provided with a slide being provided for insulation, in said second position, of the main enclosure from the auxiliary chamber, whereby the material of the evaporation cell can thus be changed without placing the main enclosure under atmosphere again, wherein the device further comprises a fixed heating tube connecting the main elcosure to the auxiliary chamber, said tube having a first end engaged in the main enclosure and a second end issuing into the auxiliary chamber, said second end being provided with an end piece, made from a thermally insulating material ensuring mechanical continuity and thermal insulation with the support part and able to bearingly receive the evaporation cell when the latter is in the advanced position, the slide of the sealing valve being inserted between the said end piece and the evaporation cell when the latter is in the retracted position, travel of the cell between these end positions and consequently travel of the bellows being limited to the space necessary for closing the valve.

2. A device according to claim 1, wherein the heating tube is constituted by an insulating tube surrounded by a heating filament.

3. A device according to either of the claims 1 and 2, wherein the heating tube is surrounded by a heat shield.

4. The device of claim 2 wherein said insulating tube is composed of silica and said heating element is composed of tantalum.

5. A device according to claim 1, wherein the part for connecting the end of the heating tube to the support is made from alumina.

6. A device according to claim 1, wherein the heating tube is constituted by a metal tube, surrounded by a heating filament electrically insulated from the tube.

* * * * *